(12) United States Patent
Ramachandran et al.

(10) Patent No.: US 10,818,632 B1
(45) Date of Patent: Oct. 27, 2020

(54) STRUCTURE AND METHOD FOR FABRICATING A COMPUTING SYSTEM WITH AN INTEGRATED VOLTAGE REGULATOR MODULE

(71) Applicant: Apple Inc., Cupertino, CA (US)

(72) Inventors: Vidhya Ramachandran, Cupertino, CA (US); Jun Zhai, San Jose, CA (US); Chonghua Zhong, Cupertino, CA (US); Kunzhong Hu, Cupertino, CA (US); Shawn Searles, Austin, TX (US); Joseph T. DiBene, II, Corralitos, CA (US); Mengzhi Pang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/943,673

(22) Filed: Apr. 2, 2018

Related U.S. Application Data

(63) Continuation of application No. 15/264,087, filed on Sep. 13, 2016, now Pat. No. 9,935,076.

(60) Provisional application No. 62/234,776, filed on Sep. 30, 2015.

(51) Int. Cl.
*H01L 23/00* (2006.01)
*H01L 21/66* (2006.01)
*H01L 21/77* (2017.01)

(52) U.S. Cl.
CPC .............. *H01L 24/73* (2013.01); *H01L 21/77* (2013.01); *H01L 22/20* (2013.01); *H01L 24/17* (2013.01); *H01L 24/32* (2013.01); *H01L 2924/12* (2013.01); *H01L 2924/1205* (2013.01); *H01L 2924/1206* (2013.01); *H01L 2924/1427* (2013.01); *H01L 2924/1436* (2013.01)

(58) Field of Classification Search
CPC ......... H01L 24/73; H01L 24/17; H01L 24/32; H01L 21/77; H01L 22/20; H01L 2924/1436; H01L 2924/12; H01L 2924/1427; H01L 2924/1205; H01L 2924/1206
See application file for complete search history.

(56) References Cited

U.S. PATENT DOCUMENTS

| | | | |
|---|---|---|---|
| 6,943,044 B1 * | 9/2005 | Ting | G01R 31/31922 438/14 |
| 7,741,153 B2 | 6/2010 | Caron | |
| 7,969,009 B2 * | 6/2011 | Chandrasekaran | H01L 25/0655 257/758 |
| 8,629,562 B2 | 1/2014 | Caron | |

(Continued)

*Primary Examiner* — Victor A Mandala
(74) *Attorney, Agent, or Firm* — Kowert, Hood, Munyon, Rankin & Goetzel, P.C.

(57) ABSTRACT

Systems that include integrated circuit dies and voltage regulator units are disclosed. Such systems may include a voltage regulator module and an integrated circuit mounted in a common system package. The voltage regulator module may include a voltage regulator circuit and one or more passive devices mounted to a common substrate, and the integrated circuit may include a System-on-a-chip. The system package may include an interconnect region that includes wires fabricated on multiple conductive layers within the interconnect region. At least one power supply terminal of the integrated circuit may be coupled to an output of the voltage regulator module via a wire included in the interconnect region.

14 Claims, 16 Drawing Sheets

(56) References Cited

U.S. PATENT DOCUMENTS

| | | |
|---|---|---|
| 9,129,817 B2 | 9/2015 | Elsherbini |
| 9,230,944 B1 | 1/2016 | Lambert |
| 9,397,567 B2 | 7/2016 | Searles |
| 9,548,288 B1* | 1/2017 | Ramachandran ........ H01L 21/78 |
| 9,595,514 B2* | 3/2017 | Bruno .................. H01L 23/5389 |
| 9,679,801 B2* | 6/2017 | Lai ....................... H01L 23/5384 |
| 2009/0195295 A1* | 8/2009 | Uematsu .................... G06F 1/26 327/530 |
| 2010/0033236 A1* | 2/2010 | Triantafillou ......... H01L 23/645 327/540 |
| 2010/0246152 A1* | 9/2010 | Lin .......................... H01L 24/92 361/783 |
| 2014/0268615 A1* | 9/2014 | Yun ................... H01L 23/49827 361/782 |
| 2014/0306673 A1* | 10/2014 | Le ........................... H02M 3/04 323/266 |
| 2015/0022173 A1 | 1/2015 | Le |
| 2015/0041955 A1 | 2/2015 | Zerbe |
| 2015/0160701 A1* | 6/2015 | Bruno .................. H01L 23/367 361/679.31 |
| 2016/0093588 A1* | 3/2016 | Wang ...................... H01L 24/00 257/737 |
| 2016/0190113 A1* | 6/2016 | Sharan .................... H01L 25/16 257/531 |
| 2016/0358889 A1* | 12/2016 | Lai ....................... H01L 21/768 |

\* cited by examiner

STRUCTURE AND METHOD FOR FABRICATING A COMPUTING SYSTEM WITH AN INTEGRATED VOLTAGE REGULATOR MODULE

PRIORITY CLAIM

The present application is a continuation of U.S. application Ser. No. 15/264,087 (now U.S. Pat. No. 9,935,076), filed Sep. 13, 2016, which claims priority to U.S. Provisional Appl. No. 62/234,776, filed Sep. 30, 2015; the disclosures of each of the above-referenced applications are incorporated by reference herein in their entireties.

BACKGROUND

Technical Field

Embodiments described herein relate to integrated circuit packages, and more particularly, to techniques for packaging voltage regulators.

Description of the Related Art

A variety of electronic devices are now in daily use with consumers. Particularly, mobile devices have become ubiquitous. Mobile devices may include cell phones, personal digital assistants (PDAs), smart phones that combine phone functionality and other computing functionality such as various PDA functionality and/or general application support, tablets, laptops, net tops, smart watches, wearable electronics, etc.

Such mobile devices may include multiple integrated circuits, each performing different tasks. In some cases, circuits that perform different tasks may be integrated into a single integrated forming a system on a chip (SoC). The different functional units within a SoC may operate at different power supply voltage levels. In some designs, power supply or regulator circuits may be included in the SoC to generate different voltage levels for the myriad functional units included in the SoC.

Voltage regulators may employ one or more passive components, such as, e.g., inductors and capacitors in order to improve performance. The fabrication of such passive components may employ different processing steps and materials than those used in manufacturing an SoC. In such cases, the passive components may be manufactured separately from the SoC.

SUMMARY OF THE EMBODIMENTS

Various embodiments of a system package are disclosed. Broadly speaking, a system is contemplated in which a module includes one or more passive circuit elements, an interconnect region, and a voltage regulator controller die configured to generate a regulated power supply using the one or more passive circuit elements. The interconnect region may include a plurality of conductive paths, and each conductive path may include a plurality of wires fabricated on a plurality of conductive layers. The voltage regulator controller die may include a plurality of terminals, and a first subset of the plurality of terminals may be coupled to respective terminals of a give passive circuit element via a first subset of the plurality of conductive paths. Each terminal of a second subset of the plurality of terminals may be coupled to respective solder balls of a plurality of solder balls via a given path of a second subset of the plurality of conductive paths.

In one embodiment, each of the one or more passive circuit elements includes at least one inductor and one capacitor.

In a further embodiment, the at least one inductor is included in a first integrated circuit die, and the at least one capacitor is included in a second integrated circuit die.

BRIEF DESCRIPTION OF THE DRAWINGS

The following detailed description makes reference to the accompanying drawings, which are now briefly described.

Figure 1:
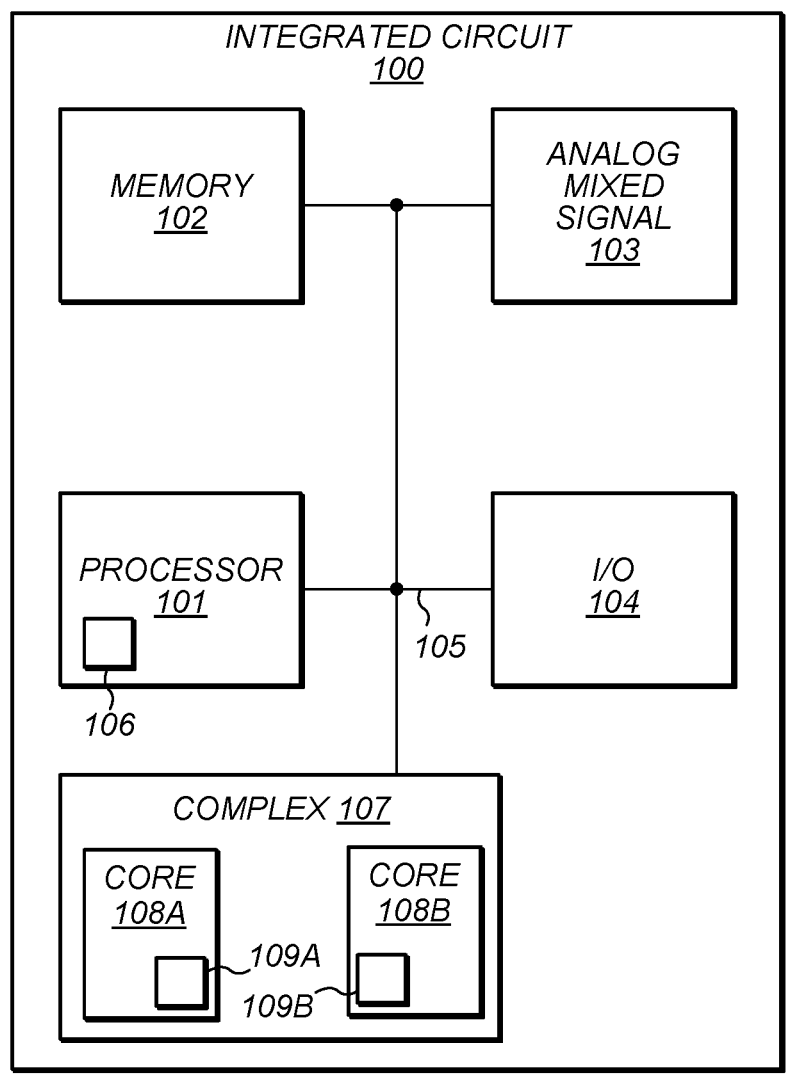
FIG. 1 illustrates an embodiment of an integrated circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

In a computing system, it may be desirable to operate different functional units of a System-on-a-chip (SoC) at different power supply voltage. In some cases, the computing system that includes such an SoC may only receive a particular power supply voltage from a battery or other suitable DC power supply. In order to generate the desired power supply voltage levels, a voltage regulator circuit may be employed.

Voltage regulator circuit may be designed according to one of various design styles. In some cases, passive components, such as, e.g., inductors and capacitors, are employed to improve the efficiency of voltage regulator circuits.

A manufacturing process used to fabricate voltage regulator circuits or SoCs may not be well suited for fabricating inductors and capacitors. As such, in some cases, inductors and capacitors to be used with voltage regulator circuits may be fabricated separately from the voltage regulator circuits and SoCs, and the mounted on a common circuit board or other suitable medium.

In small form factor applications, such as, e.g., mobile computing devices, reduced footprint assemblies of the voltage regulator circuit, SoC, and passive devices may be desirable. The embodiments illustrated in the drawings and described below may provide techniques assembling voltage regulator circuits, their related passive circuit elements, and other integrated circuits in a common system package while minimizing the package footprint.

A block diagram of an integrated circuit including multiple functional units is illustrated in FIG. 1. In the illustrated embodiment, the integrated circuit 100 includes a processor 101, and a processor complex (or simply a "complex") 107 coupled to memory block 102, and analog/mixed-signal block 103, and I/O block 104 through internal bus 105. In various embodiments, integrated circuit 100 may be configured for use in a desktop computer, server, or in a mobile computing application such as, e.g., a tablet or laptop computer.

As described below in more detail, processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include one or more energy modeling units 106 which may be configured to estimate both dynamic and leakage power consumption on a cycle and execution thread basis. In other embodiments, any functional unit, such as, e.g., I/O block 104, may include an energy modeling unit.

Complex 107 includes processor cores 108A and 108B. Each of processor cores 108A and 108B may be representative of a general-purpose processor configured to execute software instructions in order to perform one or more computational operations. Processor cores 108A and 108B may be designed in accordance with one of various design styles. For example, processor cores 108A and 108B may be implemented as an ASIC, FPGA, or any other suitable processor design. Each of processor cores 108A and 108B may, in various embodiments, include energy modeling units 109A and 109B, respectively. Energy modeling units 109A and 109B may each monitor energy usage within their respective processor cores thereby allowing, in some embodiments, accounting of energy associated with a given process being executed across multiple processor cores.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 1, a single memory block is depicted. In other embodiments, any suitable number of memory blocks may be employed.

Analog/mixed-signal block 103 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 103 may be configured to perform power management tasks with the inclusion of on-chip power supplies and voltage regulators. Analog/mixed-signal block 103 may also include, in some embodiments, radio frequency (RF) circuits that may be configured for operation with wireless networks.

I/O block 104 may be configured to coordinate data transfer between integrated circuit 100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol.

I/O block 104 may also be configured to coordinate data transfer between integrated circuit 100 and one or more devices (e.g., other computer systems or integrated circuits) coupled to integrated circuit 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

In some embodiments, each of the aforementioned functional units may include multiple circuits, each of which may include multiple devices, such as, e.g., metal-oxide semiconductor field-effect transistors (MOSFETs) connected via multiple wires fabricated on multiple conductive layers. The conductive layers may be interspersed with insulating layers, such as, silicon dioxide, for example. Each circuit may also contain wiring, fabricated on the conductive layers, designated for a power supply net or a ground supply net.

Integrated circuit 100 may, in various embodiments, be fabricated on a silicon wafer (or simply "wafer") along with numerous identical copies of integrated circuit 100, each of which may be referred to as a "chip" or "die." During manufacture, various manufacturing steps may be performed on each chip in parallel. Once the manufacturing process has been completed, the individual chips may be removed from the wafer by cutting or slicing through unused areas between each chip.

It is noted that the embodiment illustrated in FIG. 1 is merely an example. In other embodiments, different functional units, and different arrangements of functional units may be employed.

Figure 2:
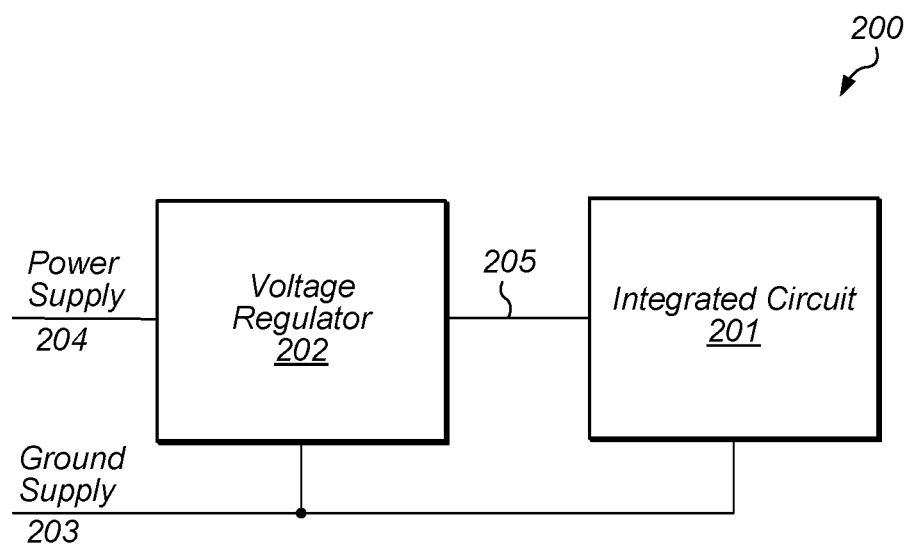
FIG. 2 illustrates an embodiment of a computing system employing a voltage regulator.

Turning now to FIG. 2, an embodiment of a computing system that includes a voltage regulator is illustrated. In the illustrated embodiment, computing system 200 includes voltage regulator 202, which is coupled to integrated 201 via regulated power supply 205. Each of voltage regulator 202 and integrated circuit 201 is coupled to ground supply 203, and voltage regulator 202 is further coupled to power supply 204. In various embodiments, integrated circuit 201 may correspond to integrated circuit 100 as illustrated in FIG. 1.

During operation, voltage regulator 202 may generate a voltage level on regulated supply 205. Depending on integrated circuit 201, the voltage level of regulated supply 205 may be higher or lower than the voltage level on power supply 204. The voltage level on regulated supply 205 may vary within predetermined limits from a desired voltage level. The variation may result from changes in the voltage level on power supply 204, variations in temperature, or changes in current demand from integrated circuit 201. Although only a single regulated power supply is depicted in the embodiment illustrated in FIG. 2, in other embodiments, voltage regulator 202 may be configured to generate multiple regulated power supplied.

Voltage regulator 202 may be designed in accordance with one of varying design styles. In some embodiments, voltage regulator 202 may employ a combination of active and passive devices (not shown). Such passive devices may, in some embodiments, include any suitable combination of inductors and capacitors. In various embodiments, integrated circuit 201 and voltage regulator may be fabricated using different semiconductor manufacturing processes, and may be mounted in a common integrated circuit package or mounted on a common substrate.

It is noted that the embodiment illustrated in FIG. 2 is merely an example. In other embodiments, different numbers of integrated circuits, and different numbers of voltage regulators providing different voltages levels are possible and contemplated.

Figure 3:
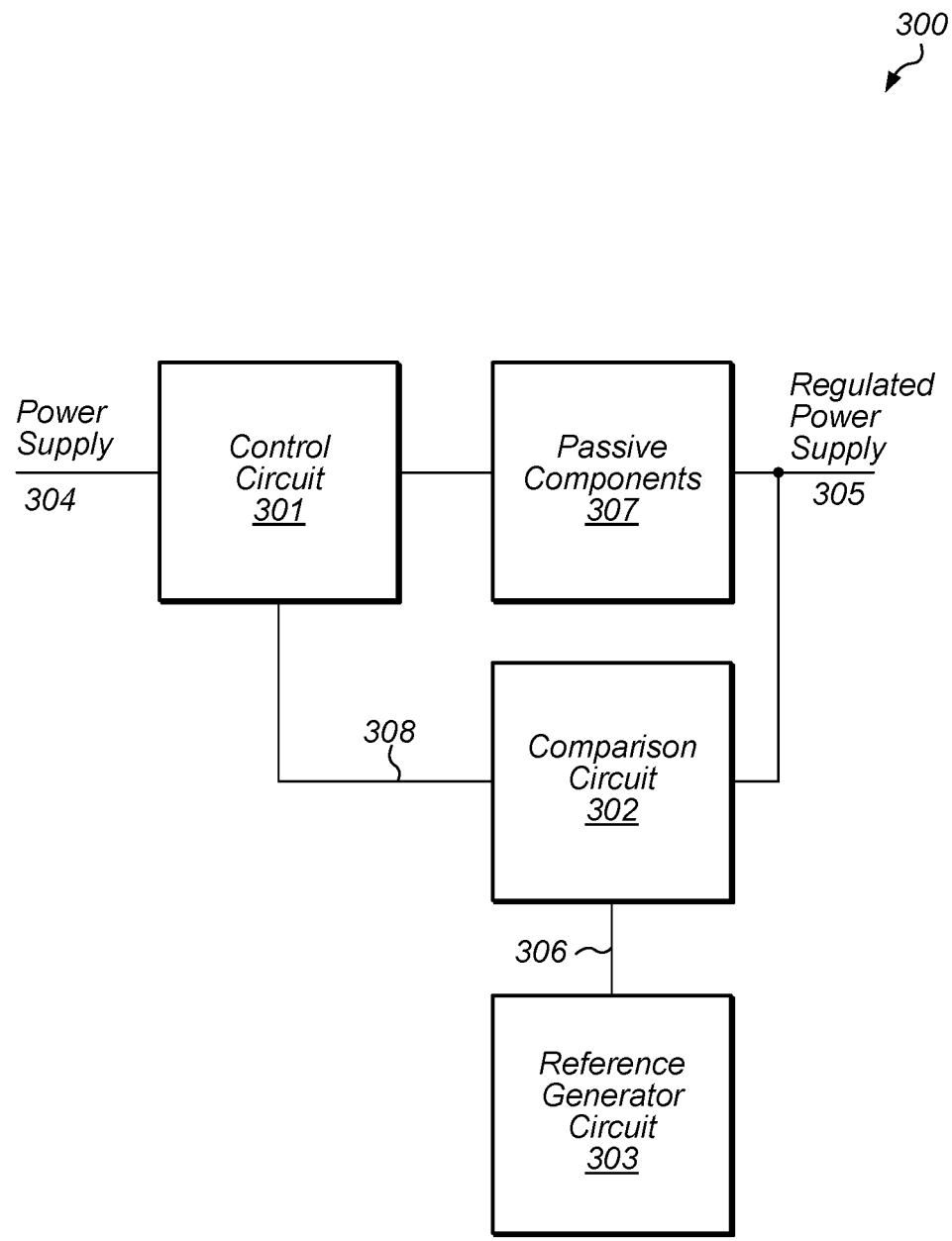
FIG. 3 illustrates a block diagram depicting an embodiment of a voltage regulator.

A block diagram of an embodiment of a voltage regulator unit is illustrated in FIG. 3. In the illustrated embodiment, voltage regulator 300 includes control circuit 301, passive components 307, comparison circuit 302, and reference generator circuit 303. In various embodiments, voltage regulator 300 may correspond to voltage regulator 200 as depicted in FIG. 2. Each of control circuit 301, comparison circuit 302, reference generator circuit 303, and passive components 307 may be mounted together on a single substrate. In some embodiments, control circuit 301, comparison circuit 302, and reference generator circuit 303 may be fabricated together on a common integrated circuit or other suitable substrate compatible with a semiconductor manufacturing process.

Control circuit 301 may be configured to receive power supply 304, and source current to regulator power supply 305 through passive components 307 dependent on control signal 308. In various embodiments, control circuit 301 may include multiple metal-oxide semiconductor field-effect transistors (MOSFETs) or other suitable transconductance devices capable of selectively applying current to regulated power supply 305. Passive components 307 may, in some embodiments, include one or more inductors, and one or more capacitors, or any other suitable passive component. In various embodiments, the components included in passive components 307 may be fabricated together on a single silicon substrate, or they may be manufactured on separate silicon substrates using different semiconductor manufacturing processes.

Comparison circuit 302 may, in various embodiments, be configured to compare a voltage level on regulated power supply 305 and a voltage level on reference voltage 306. In response to the comparison, comparison circuit 302 may adjust a voltage level on control signal 308. In some embodiments, control signal 308 may switch between multiple discrete voltage levels, each of which represents a logic level. Alternatively, control signal 308 may be an analog signal, which may assume a continuous spectrum of voltage levels.

In various embodiments, reference generator circuit 303 may be configured to generate a voltage level on reference voltage 306 dependent on the voltage level on power supply 304. The voltage level on reference voltage 306 may, in some embodiments, correspond to a desired voltage level for an integrated circuit, such as integrated circuit 100 as illustrated in FIG. 1, for example. In some embodiments, reference generator circuit 303 may include one or more sub-circuits (not shown), such as, band gap reference circuits, current mirrors, and the like.

The embodiment illustrated in FIG. 3 is merely an example. In other embodiments, different functional units and different circuit topologies may be employed.

Figure 4:
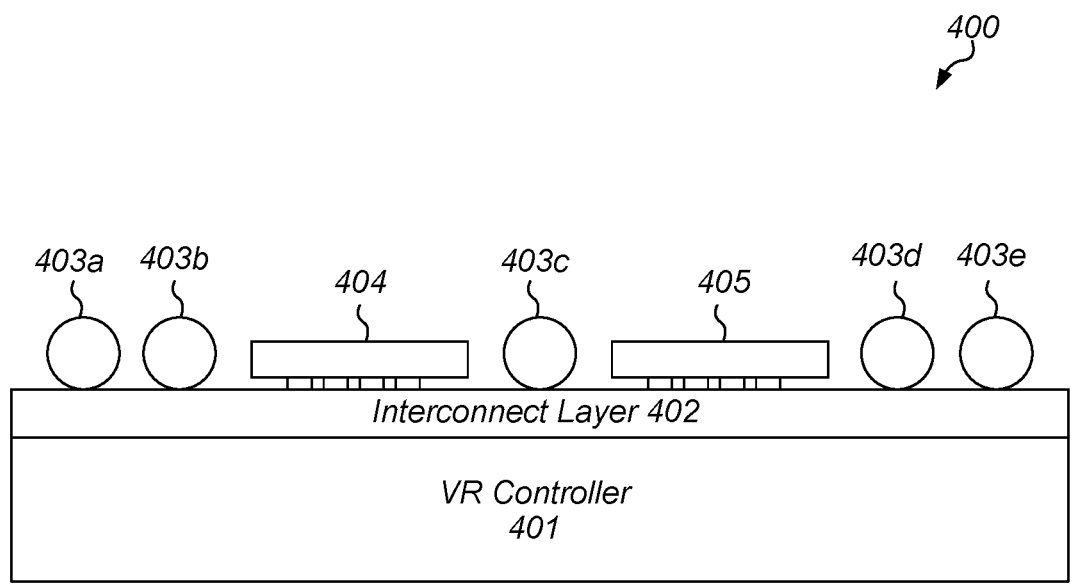
FIG. 4 illustrates an embodiment of a voltage regulator module.

Turning to FIG. 4, an embodiment of a voltage regulator module (VRM) is illustrated. In the illustrated embodiment, VRM 400 includes VR Controller 401, interconnect layer 402, inductor 404, and capacitor 405. In various embodiments, VR Controller 401 may correspond to portions of voltage regulator 300, namely control circuit 301, comparison circuit 302, and reference generator 303.

Interconnect layer 402 is coupled to the top of VR Controller 401. In various embodiments, interconnect layer 402 may include multiple wires fabricated on multiple conductive layers included within interconnect layer 402. Such wires may provide routing paths from signal and power terminals on VR Controller 401 to solder bumps 403a-403e, and terminals on inductor 404 and capacitor 403. In some embodiments, interconnect layer 402 may be fabricated onto VR Controller 401 using a wafer scale packaging process or other suitable assembly process. As used and described herein, a signal terminal may refer to a terminal on an integrated circuit, passive device, or interconnect layer or region, through which an electrical signal may be transmitted. Such an electrical signal may include either analog or digital signals. Additionally, a power terminal, as used and described herein, may refer to a terminal on an integrated circuit, passive device, or interconnect layer or region dedicated to power supply or ground supply connections.

In various embodiments, inductor 404 and capacitor 405 may be fabricated on a silicon or other suitable substrate using a semiconductor manufacturing process. Alternatively, or additionally, inductor 404 and capacitor 405 may be discrete components manufactured using any suitable manufacturing process.

It is noted that the embodiment illustrated in FIG. 4 is merely an example. In other embodiments, different number of inductors and capacitors, and different arrangements of the inductors and capacitors are possible and contemplated.

Figure 5:
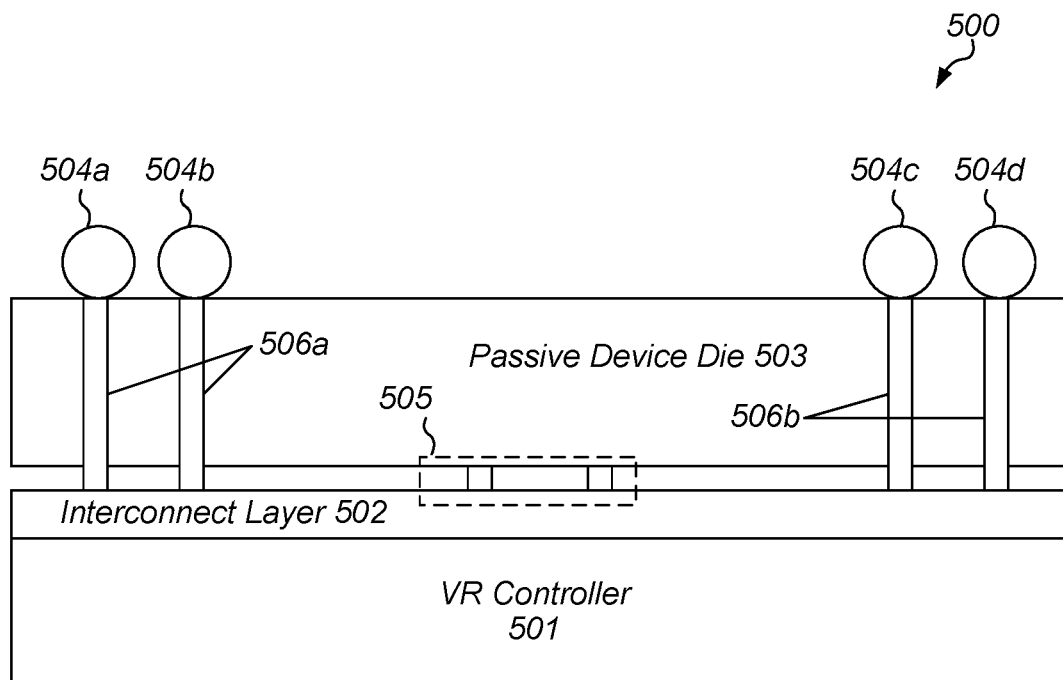
FIG. 5 illustrates an embodiment of a voltage regulator module.

A different embodiment of a VRM is depicted in FIG. 5. In the illustrated embodiment, VRM 500 includes VR Controller 501, interconnect layer 502, and passive device die 503. In various embodiments, VR Controller 501 and interconnect layer 502 may correspond to VR Controller 401 and interconnect layer 402, respectively, as depicted in the embodiment illustrated in FIG. 4.

Passive device die 503 may, in various embodiments, include one or more inductors and capacitors, and may be manufactured using a semiconductor manufacturing process. During manufacture, connection paths 506a and 506b (also referred to herein as "vias" or "through silicon vias") are created in passive device die 503 to allow connections from solder bumps 504a-504d to terminals on interconnect layer 502, which, in turn, are coupled to terminals on VR controller 501. The passive devices included in passive device die 503 may be coupled to circuitry included in VR Controller 501 through connectors 505. In various embodiments, connectors 505 may be solder bumps or any other medium suitable for coupling passive device die 503 to VR controller 501.

The embodiment illustrated in FIG. 5 is a particular example of a VRM. In other embodiments, different numbers vias and connectors may be employed.

Figure 6:
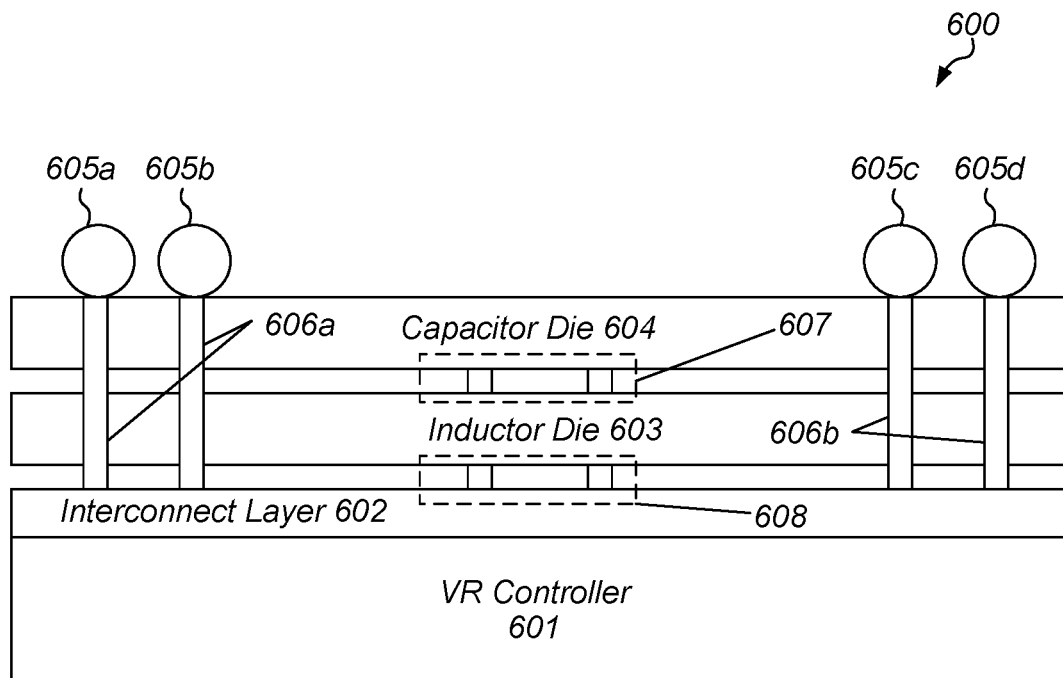
FIG. 6 illustrates an embodiment of a voltage regulator module.

Turning to FIG. 6, another embodiment of a VRM is illustrated. In the illustrated embodiment, VRM 600 includes VR Controller 601, inductor die 603, and capacitor die 604. In various embodiments, VR Controller 601 and may correspond to VR Controller 401 as depicted in the embodiment illustrated in FIG. 4.

Capacitor die 604 may include one or more capacitors, and inductor die 603 may include one or more inductors. Capacitor die 604 and inductor die 603 may be manufactured using respective semiconductor manufacturing processes. Each of capacitor die 640 and inductor die 603 include routing paths through the die that form vias 606a and 606b, thereby allowing connects from solder bumps 605a-605d to terminals on interconnect layer 602. In various embodiments, interconnect layer 602 may include multiple wires fabricated on multiple conductor layers forming connections between terminals on VR Controller 601 and terminals on interconnect layer 602.

Terminals on capacitor die 604 are coupled to a first set of terminals on inductor die 603 via connectors 607. Additionally, a second set of terminals on inductor die 603 are coupled to terminals on interconnect layer 602 via connectors 608. In various embodiments, connectors 607 and 608 may include solder bumps or any other suitable medium. In some embodiments, space between capacitor die 604 and inductor die 603 may be filled with an electrically insulating material (not shown), such as, silicon dioxide, for example. In a similar fashion, space between inductor die 603 and interconnect layer 602 may also be filled with the insulating material.

It is noted that the embodiment depicted in FIG. 6 is merely an example. In other embodiments, different arrangements of the inductor and capacitor dies may be employed.

Figure 7:
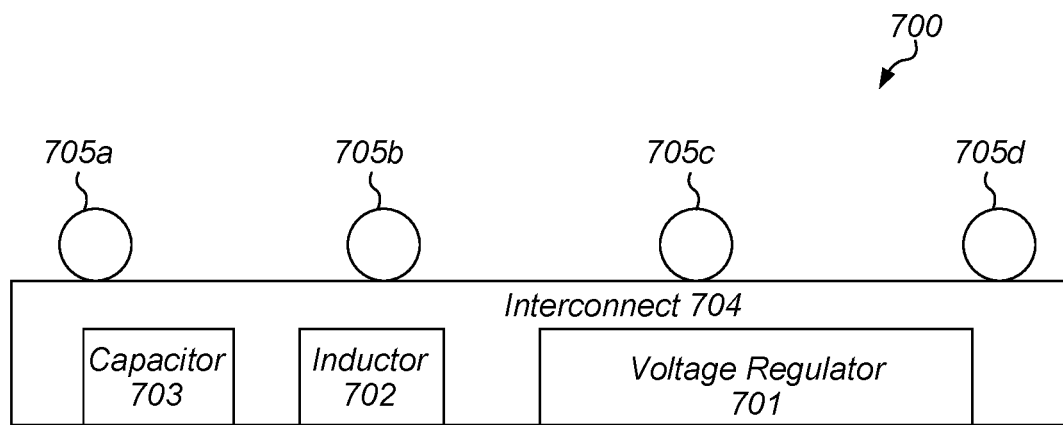
FIG. 7 illustrates an embodiment of a voltage regulator module.

A different embodiment of a VRM is illustrated in FIG. 7. In the illustrated embodiment, VRM 700 includes voltage regulator 701, inductor 702, and capacitor 703. In various embodiments, voltage regulator 701 may correspond to VR Controller 401 as illustrated in the embodiment of FIG. 4. In some embodiments, each of voltage regulator 701, inductor 702, and capacitor 703 may be chips or dies manufactured using respective semiconductor manufacturing processes.

Voltage regulator 701, inductor 702, and capacitor 703 may be arranged in a planar fashion. Interconnect 704 may be fabricated or assembled on top of the arrangement of voltage regulator 701, inductor 702, and capacitor 703. In various embodiments, interconnect 704 may include multiple wires (not shown), fabricated on multiple metal layers separated by multiple insulating layers, that connect terminals of voltage regulator 701 to terminals on inductor 702 and capacitor 703. Additionally, some of the multiple wires included in interconnect 704 may couple terminals of voltage regulator to solder bumps 705a-705d.

The embodiment illustrated in FIG. 7 is merely an example. In other embodiments, different arrangements of voltage regulator 701, inductor 702, and capacitor 703 are possible and contemplated.

Figure 8:
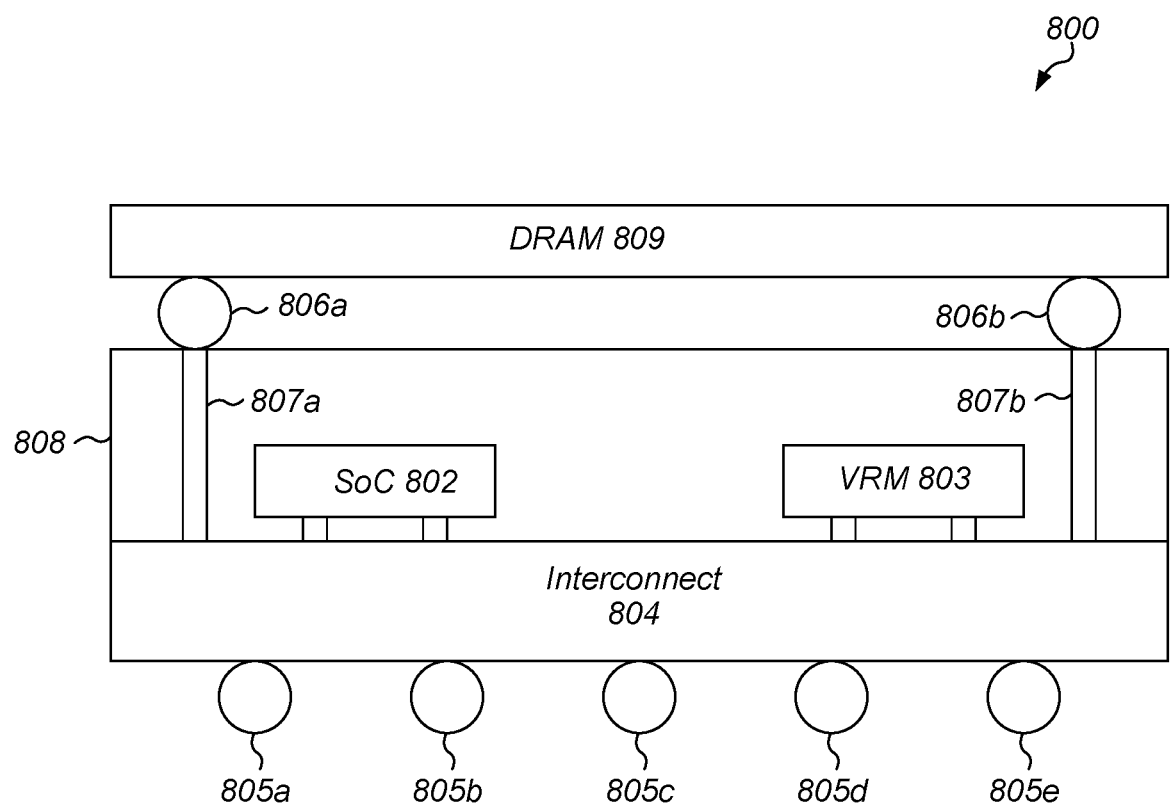
FIG. 8 illustrates an embodiment of a system package.

To reduce parasitic circuit effects in connections between voltage regulators and SoCs, VRMs and SoCs may be mounted in a common package, commonly referred to as a "system package." An embodiment of a system package is illustrated in FIG. 8. In the illustrated embodiments, system package 800 includes interconnect 804, SoC 802, and VRM 803. In various embodiments, VRM 803 may correspond to any of the embodiments illustrated in FIG. 4 through FIG. 7, and SoC 802 may correspond integrated circuit 100 as illustrated in FIG. 1.

Each of SoC 802 and VRM 803 are coupled to interconnect 804. In various embodiments, interconnect 804 includes multiple wires fabricated on multiple wiring layers. Some of the multiple wires of interconnect 804 may couple terminals on SoC 802 to terminals on VRM 803, thereby allowing a regulated power supply from VRM 803 to be coupled to SoC 802. Additionally, some of the multiple wires included in interconnect 804 may couple terminals on SoC 802 and VRM 803 to solder bumps 805a-805e.

On a side of the package body 808 opposite from solder bumps 805a-805e, solder bumps 806a-b couple DRAM 809 to package body 808. In various embodiments, package body 808 includes vias 807a-b that couple solder bumps 806a-b to terminals on interconnect 804. Wires included in interconnect 804 may then connect the aforementioned terminals of interconnect 804 to terminals of SoC 803. Although a DRAM is included in system package 800, in other embodiments, any suitable memory may be employed.

It is noted that the embodiment illustrated in FIG. 8 is merely an example. In other embodiments, chips or dies other than SoC 802 and VRM 803 may be included in system package 800.

Figure 9:
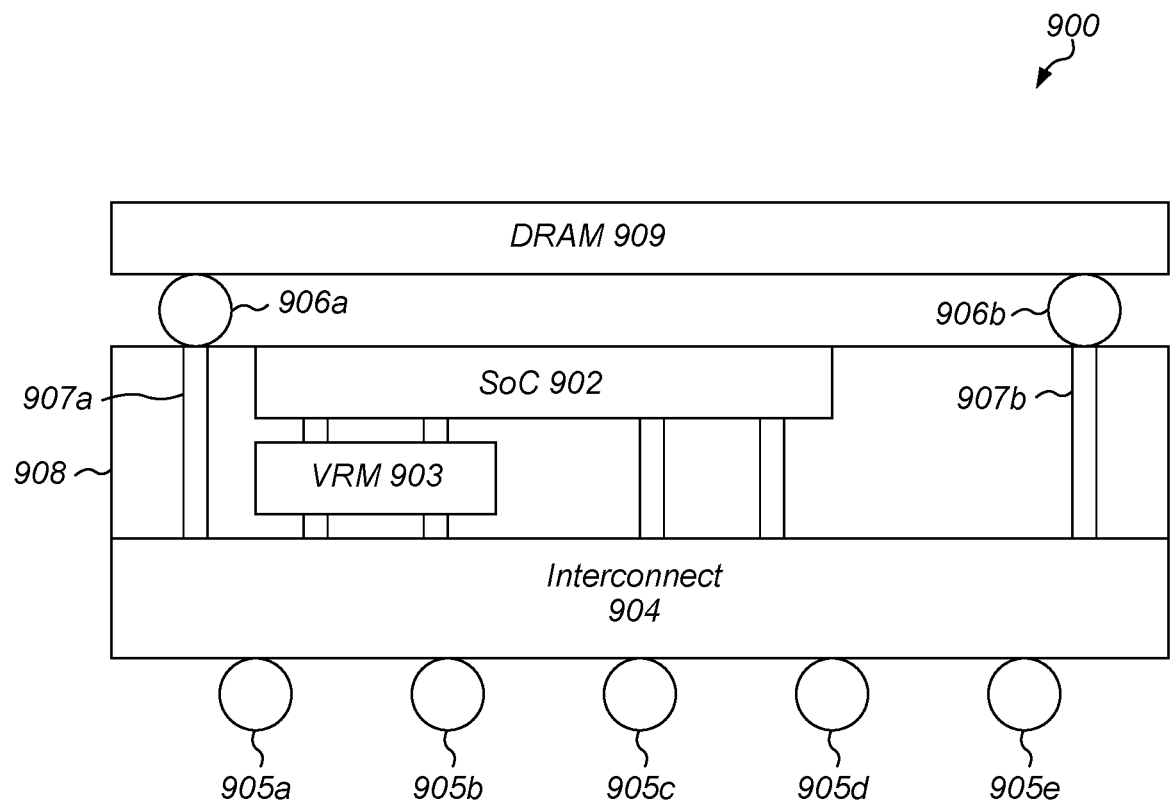
FIG. 9 illustrated an embodiment of a system package.

Turning to FIG. 9, another embodiment of a system package is illustrated. In the illustrated embodiment, system package 900 includes interconnect 904, VRM 903, and SoC 902. In various embodiments, VRM 903 may correspond to any of the embodiments illustrated in FIG. 4 through FIG. 7, and SoC 902 may correspond integrated circuit 100 as illustrated in FIG. 1.

Interconnect 904 includes multiple wires fabricated on multiple wiring layers. Some of the multiple wires of interconnect 904 may couple terminals on SoC 902 and VRM 903, to solder bumps 905a-905e. In contrast to the embodiment depicted in FIG. 8, some power terminals of SoC 902 are coupled directly to output terminals of VRM 903, allowing VRM 903 to provide a regulated power supply to SoC 902.

In a similar fashion to the embodiment of FIG. 8, DRAM 909 is mounted to package body 908 allowing connections to terminals on interconnect 904. Wires included in interconnect 904 may couple vias 907a-b to terminals of SoC 902. As noted above, in regard to FIG. 8, DRAM 909 may, in other embodiments, include as any suitable type of memory.

It is noted that the embodiment illustrated in FIG. 9 is merely an example. In other embodiments, different arrangements of VRM 903 and SoC 902 may be employed.

Figure 10:
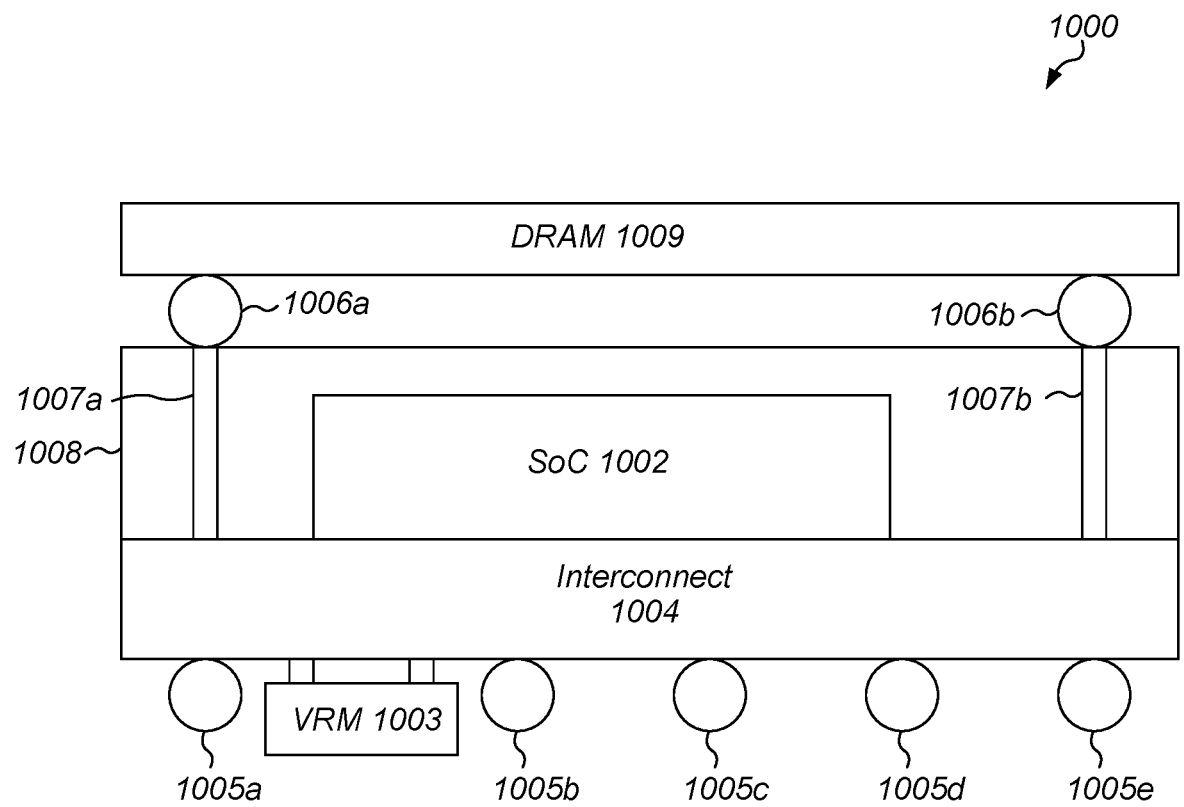
FIG. 10 illustrates an embodiment of a system package.

A different embodiment of a system package is illustrated in FIG. 10. In the illustrated embodiment, system package 1000 includes interconnect 1004, SoC 1002, and VRM 1003. In various embodiments, VRM 1003 may correspond to any of the embodiments depicted in FIG. 4 through FIG. 7, and SoC 1002 may correspond to integrated circuit 100 as illustrated in the embodiment of FIG. 1.

Terminals of SoC 1002 are coupled to terminals of interconnect 1004, which are, in turn, coupled to wires included interconnect 1004. In various embodiments, the wires included in interconnect 1004 may be fabricated on multiple metal layers separated by insulating layers. Some of the wires included in interconnect 1004 may be coupled to solder bumps 1005a-e, thereby allowing connections from SoC 1002 to solder bumps 1005a-e.

In contrast to the embodiment depicted in FIG. 9, VRM 1003 is mounted on a side of interconnect 1004 opposite the side on which SoC 1002 is mounted. Some of the wires included in interconnect 1004 may couple output terminals of VRM 1003 to power terminals of SoC 1002, thereby allowing VRM 1003 to source a regulated power supply to SoC 1002. Other wires included in interconnect 1004 may connect power terminals of VRM 1003 to one or more of solder bumps 1005a-e, providing power and ground paths to VRM 1003.

DRAM 1009 is coupled to package body 1008 using solder bumps 1006a-b. Vias 1007a-b couple solder bumps 1006a-b to terminals on interconnect 1004. Wires included in interconnect 1004 may couple the aforementioned terminals on interconnect 1004 to terminals on SoC 1002. In some embodiments, the terminals on interconnect 1004 coupled to vias 1007a-b may be coupled one or more of solder bumps 1005a-b.

It is noted that the relative placement between SoC 1002 and VRM 1003 as depicted in the embodiment of FIG. 10 is merely an example.

Figure 11:
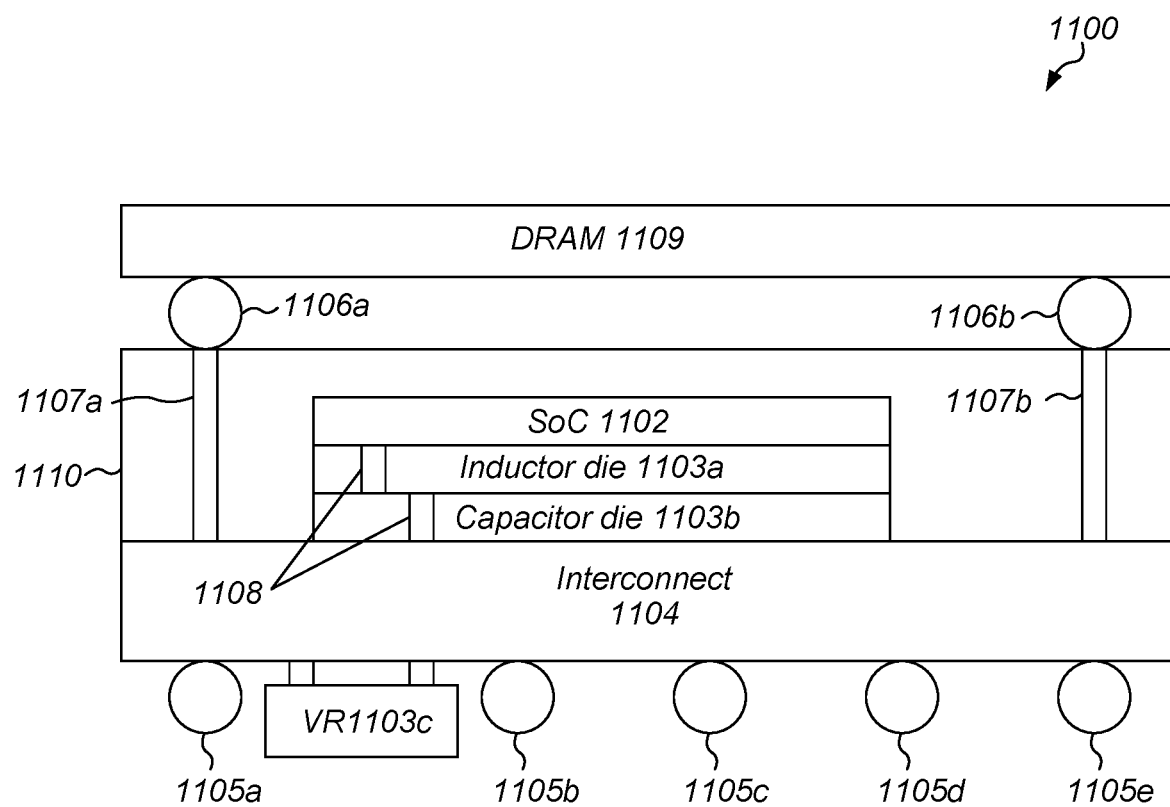
FIG. 11 illustrates an embodiment of a system package.

Turning to FIG. 11, a different embodiment of a system package is illustrated. In the illustrated embodiment, system package 1100 includes SoC 1102, VR 1103c, inductor die 103a, and capacitor die 1103b. In various embodiments, voltage regulator (also referred to herein as "VR") 1103c may correspond to portions of voltage regulator 300, namely control circuit 301, comparison circuit 302, and reference generator 303 as illustrated in FIG. 3, and SoC 1102 may correspond to integrated circuit 100 as illustrated in FIG. 1.

Capacitor die 1103b, inductor die 1103a, and SoC 1102 are arranged in a stack and mounted on interconnect 1104. In various embodiments, inductor die 1103a and capacitor die 1103b may include vias that allow terminals on SoC 1102 to be coupled to terminals of interconnect 1104 through inductor die 1103a and capacitor die 1103b. It is noted that, in various embodiments, inductor die 1103a may include multiple inductors fabricated using a semiconductor manufacturing process, and capacitor die 1103b may include multiple capacitors fabricated using a similar semiconductor manufacturing process.

Package body 1110 includes vias 1107a-b, which couple solder bumps 1106a-b to terminals on interconnect 1104. Wires included in interconnect 1104 may be used to connect terminals on interconnect 1104, which are coupled to vias 1107a-b, to vias through inductor die 1103a and capacitor die 1103b, thereby allowing a signal path from DRAM 1109 to SoC 1102. Other wires included in interconnect 1104 may provide a path from terminals on SoC 1102, through inductor die 1103a and capacitor die 1103b, to solder bumps 1105a-e. It is noted that although a single DRAM is depicted in the embodiment of FIG. 11, in other embodiments, any suitable number and type of memory devices, may be employed.

VR 1103c may be mounted on a side of interconnect 1104 opposite of a side where SoC 1102, inductor die 1103a, and capacitor die 1103b are mounted. Wires included in interconnect 1104 may couple input/output terminals of VR 1103c to capacitor die 1103b. Vias included in inductor die 1103a and capacitor die 1103b may provide a wiring path from VR 1103c to SoC 1102, allowing VR 1103c to source a regulated power supply voltage to SoC 1102.

Although a particular arrangement of SoC 1102, inductor die 1103a, and capacitor die 1103c is depicted in the embodiment of FIG. 11, it is noted that the present embodiment is merely an example. In other embodiments, different arrangements of SoC 1102, inductor die 1103a, and capacitor die 1103c are possible and contemplated.

Figure 12A:
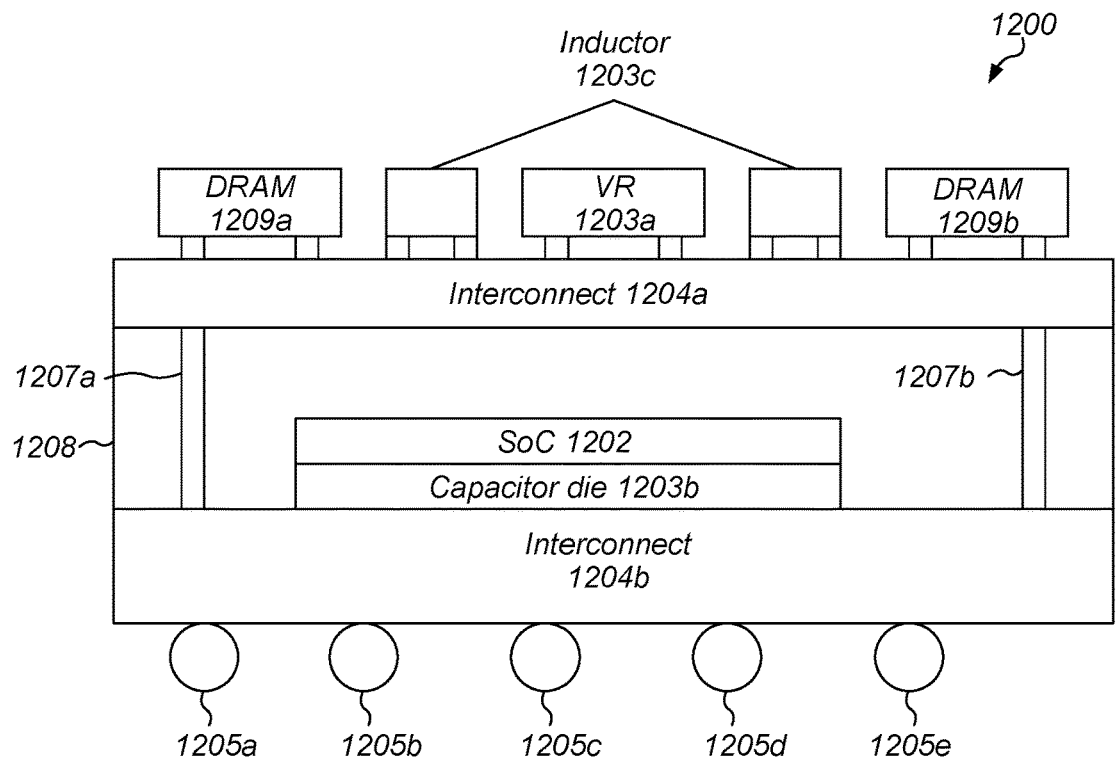
FIG. 12A illustrates an embodiment of a system package.
Figure 12B:
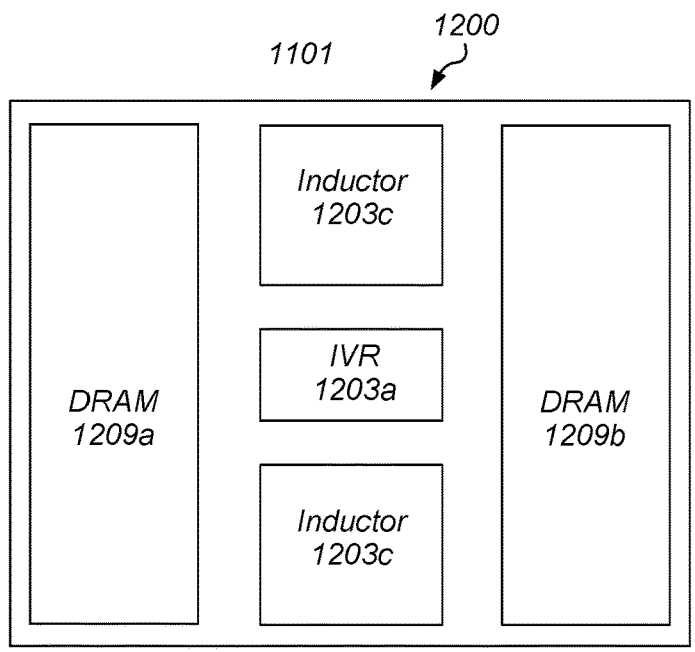
FIG. 12B illustrates a top view of the embodiment depicted in FIG. 12A.

A different embodiment of a system package is illustrated in FIG. 12A and FIG. 12B. In the illustrated embodiment, system package 1200 includes SoC 1202, capacitor die 1203b, VR 1203a, and inductor 1203c. In various embodiments, VR 1203a may correspond to portions of voltage regulator 300, namely control circuit 301, comparison circuit 302, and reference generator 303 as illustrated in FIG. 3, and SoC 1202 may correspond to integrated circuit 100 as illustrated in FIG. 1.

SoC 1202 and capacitor die 1203b are arranged in a stacked fashion in package body 1208. In some embodiments, capacitor die 1203b includes vias (not shown) that allow terminals of SoC 1202 to be coupled to interconnect 1203b. In various embodiments, interconnect 1203b includes multiple wires fabricated on multiple metal layers separated by insulating layers. Such wires may be used to connect solder bumps 1205a-e to terminals on capacitor die 1203b.

In a similar fashion, interconnect 1204a includes multiple wires that may be used to connect terminals of DRAM 1209a-b, inductor 1203c, and VR 1203a to vias 1207a-b included in package body 1208. Although only two vias are shown, in various embodiments, any suitable number of vias may be employed.

As depicted in FIG. 12, DRAM 1209a-b, inductor 1203c, and VR 1203a are mounted on the top of system package 1200. As described above, using wires in interconnect 1204a-b, and vias 1207a-b, signals and power supplies for DRAM 1209a-b, inductor 1203c, and VR 1203a may be routed to solder bumps 1205a-e or the stack of SoC 1202 and capacitor die 1203b.

It is noted that the embodiment illustrated in FIG. 12A-B is merely an example. In other embodiments, different arrangements of inductor 1203c may be employed.

Figure 13:
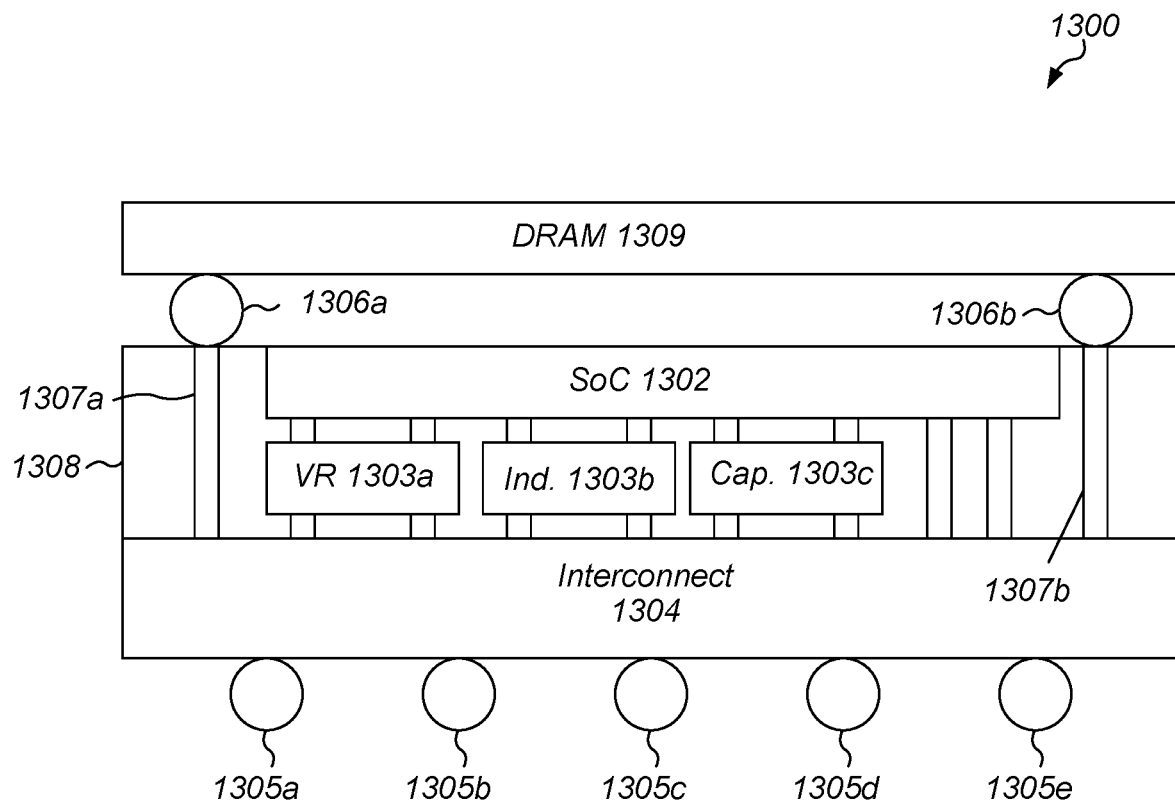
FIG. 13 illustrates an embodiment of a system package.

Turning to FIG. 13, another embodiment of a system package is illustrated. In the illustrated embodiment, system package 1300 includes SoC 1302, VR 1303a, inductor 1303b, and capacitor 1303c. In various embodiments, VR 1303a may correspond to portions of voltage regulator 300, namely control circuit 301, comparison circuit 302, and reference generator 303 as illustrated in FIG. 3, and SoC 1302 may correspond to integrated circuit 100 as illustrated in FIG. 1.

Within package body 1308, VR 1303a, inductor 1303b, and capacitor 1303c are arranged in a first layer, and SoC 1302 is arranged in a second layer. Wire and vias included within package body 1308 are employed to couple terminals of VR 1303a, inductor 1303b, and capacitor 1303c to terminals included in SoC 1302. Additionally, other wires and vias included in package body 1308 may be used to couple terminals of SoC 1302, VR 1303*a*, inductor 1303*b*, and capacitor 1303*c* to interconnect 1304.

Interconnect 1304 may, in various embodiments, include multiple wires fabricated on multiple metal layers separated by a insulating layers. In some embodiments, wires included in interconnect 1304 may provide connections between solder bumps 1305*a-e* to terminals on interconnect 1304 which are coupled to SoC 1302, VR 1303*a*, inductor 1303*b*, and capacitor 1303*c* using wires and vias included in package body 1308. Additionally, other wires included in interconnect 1304 may be employed to connect vias 1307*a-b* of package body 1308 to terminals of any of SoC 1302, VR 1303, inductor 1303*b*, and capacitor 1303*c*, to provide a wiring path between DRAM 1309 and the aforementioned subcomponents.

DRAM 1309 is coupled to solder bumps 1306*a-b*, which, in turn, are coupled to vias 1307*a-b* included in package body 1308. Although a single DRAM is depicted in the embodiment of FIG. 13, in other embodiments, any suitable number of DRAMs or other memory devices may be employed.

It is noted that the embodiment illustrated in FIG. 13 is one example of a system package. In other embodiments, different subcomponents and different arrangements of subcomponents are possible and contemplated.

Figure 14:
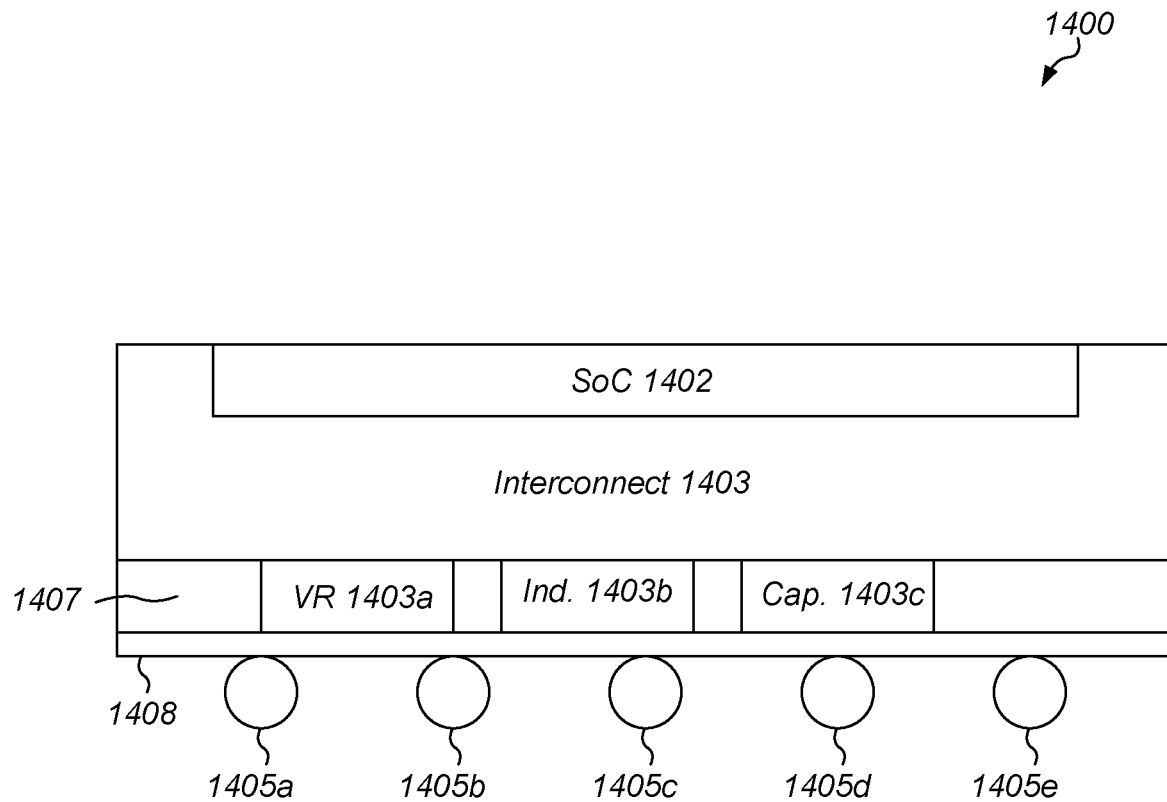
FIG. 14 illustrates an embodiment of a system package.

Another embodiment of a system package is illustrated in FIG. 14. In the illustrated embodiment, system package 1400 includes SoC 1402, VR 1403*a*, inductor 1403*b*, and capacitor 1403*c*. In various embodiments, VR 1403*a* may correspond to portions of voltage regulator 300, namely control circuit 301, comparison circuit 302, and reference generator 303 as illustrated in FIG. 3, and SoC 1402 may correspond to integrated circuit 100 as illustrated in FIG. 1.

VR 1403*a*, inductor 1403*b*, and capacitor 1403*c* are mounted on substrate core 1407, which is, in turn, mounted on interconnect 1408. In various embodiments, interconnect 1408 may include multiple wires fabricated on multiple metal layers separated by insulating layers. Some of the multiple wires included in interconnect 1408 may couple terminals of VR 1403*a* to one or more of solder bumps 1405*a-e*. Additionally, other wires included in interconnect 1408 may couple terminals of VR 1403*a* to terminals of inductor 1403*b* and capacitor 1403.

Interconnect 1403 may also include multiple wires fabricated on multiple metal layers separated by insulating layers. In various embodiments, some of the wires included in interconnect 1403 may couple terminals of SoC 1402 to terminals of VR 1403*a*, thereby allowing VR 1403*a* to source a regulated power supply to SoC 1402. Other wires included in interconnect 1403 may couple terminals of SoC 1403 to one or more of solder bumps 1405*a-e*, using vias included in substrate core 1407 (not shown).

In various embodiments, interconnect 1403 may be fabricated on top of substrate core 1407 once VR 1403*a*, inductor 1403*b*, and capacitor 1403*c* have been mounted. The fabrication process may, in some embodiments, include the deposition and etching of metal layers, deposition of insulating layers, and the like. In other embodiments, interconnect 1403 may be fabricated separately from substrate core 1407, and then attached to substrate core 1407 using any suitable attachment method.

It is noted that the embodiment illustrated in FIG. 14 is merely an example. In other embodiments, different arrangement of the components, such as, e.g., VR 1403*a*, may be employed.

Figure 15:
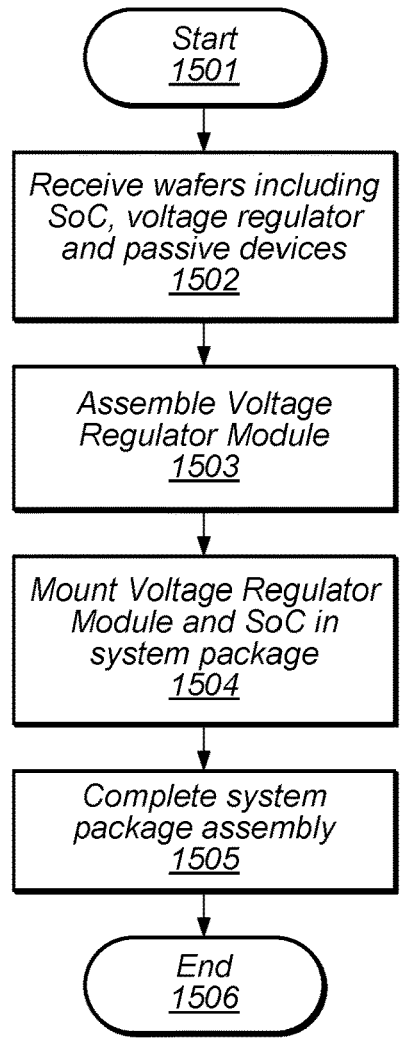
FIG. 15 illustrates a flow diagram depicting an embodiment of a method for assembling a system package.

Turning to FIG. 15, a flow diagram of an embodiment of a method for assembling a system package is illustrated. The method begins in block 1501. Wafers including multiple SoC dies, voltage regulator dies, and passive device dies may then be received (block 1502). In some embodiments, wafers for each type of die, such as, e.g., voltage regulator dies, may be fabricated using a dedicated semiconductor manufacturing process. Prior to further assembly steps, each of the wafers may be tested, and failing dies included within a given wafer may be marked so that such failing dies are not assembled into a package.

A voltage regulator die and one or more passive device dies may then be assembled into a VRM (block 1503). In various embodiments, the voltage regulator die and the one or more passive device dies may be assembled into a VRM corresponding to one of the embodiments illustrated in FIG. 4 through FIG. 7. Once the VRM is assembled, the VRM may then be mounted in a system package along with one of the SoC dies (block 1504). The system package may, in various embodiments, correspond to one of the particular embodiments of a system package illustrated in FIG. 8 through FIG. 14.

Assembly of the system package may then be completed (block 1505). In some embodiments, the final assembly may include mounting one or more memory devices into the system package. The one or more memory devices may be arranged, in various embodiments, as depicted in the embodiments illustrated in FIG. 8 through FIG. 10. In some embodiments, once the system package is assembled, a final test operation may be performed. The method may then conclude in block 1506.

Although some of the operations included in the flow diagram of FIG. 15 are depicted as being performed in parallel, in other embodiments, one or more of the operations may be performed in parallel.

Figure 16:
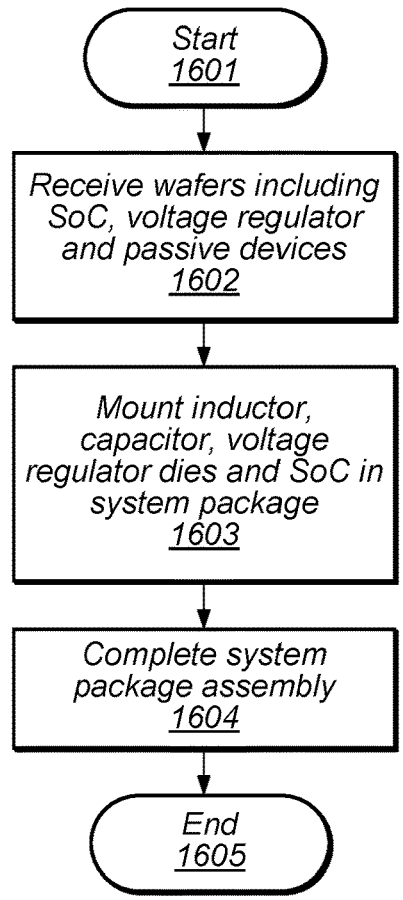
FIG. 16 illustrates a flow diagram depicting another embodiment of a method for assembling a system package.

Turning to FIG. 16, a flow diagram depicting another embodiment of a method of assembling a system package is illustrated. The method begins in block 1501. Wafers including multiple SoC dies, voltage regulator dies, and passive device dies may then be received (block 1502). In some embodiments, wafers for each type of die, such as, e.g., voltage regulator dies, may be fabricated using a dedicated semiconductor manufacturing process. Prior to further assembly steps, each of the wafers may be tested, and failing dies included within a given wafer may be marked so that such failing dies are not assembled into a package.

One each of a voltage regulator die, an inductor die, a capacitor die, and an SoC die may then be mounted in the system package (block 1603). The system package may, in various embodiments, correspond to one of the particular embodiments of a system package illustrated in FIG. 8 through FIG. 14.

Assembly of the system package may then be completed (block 1604). In some embodiments, the final assembly may include mounting one or more memory devices into the system package. The one or more memory devices may be arranged, in various embodiments, as depicted in the embodiments illustrated in FIG. 8 through FIG. 10. In some embodiments, once the system package is assembled, a final test operation may be performed. The method may then conclude in block 1605.

It is noted that the embodiment of the method depicted in the flow diagram of FIG. 16 is merely an example. In other embodiments, different operations and different orders of operations may be employed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
    receiving a first silicon wafer that includes a plurality of voltage regulator dies, including a first voltage regulator die;
    receiving a second silicon wafer that includes a plurality of passive circuit element dies, including a first passive circuit element die; and
    mounting, into a system package that includes an interconnect layer and a plurality of solder balls, the interconnect layer having a plurality of conductive traces:
    the first voltage regulator die,
    the first passive circuit element die; and
    coupling, via a first conductive trace of the plurality of conductive traces, a first terminal of the first voltage regulator die to a corresponding terminal of the first passive circuit element die; and
    coupling, via a second conductive trace of the plurality of conductive traces, a second terminal of the first voltage regulator die to a first solder ball of the plurality of solder balls.

2. The method of claim 1, wherein the first passive circuit element die includes one or more inductors.

3. The method of claim 1, wherein the first passive circuit element die includes one or more capacitors.

4. The method of claim 1, further comprising testing the first silicon wafer and the second silicon wafer.

5. The method of claim 4, wherein testing the first silicon wafer and the second silicon wafer includes identifying a given voltage regulator die of the plurality of voltage regulator dies that fails testing.

6. The method of claim 1, further comprising mounting one or more memory devices in the system package.

7. The method of claim 1, further comprising performing a final test procedure using the system package.

8. A system package made by a method comprising:
    fabricating a first silicon wafer using a first semiconductor manufacturing process, wherein the first silicon wafer includes a plurality of voltage regulator dies;
    fabricating a second silicon wafer using a second semiconductor manufacturing process different than the first semiconductor manufacturing process, wherein the second silicon wafer includes a plurality of passive circuit element dies; and
    mounting, into the system package that includes an interconnect layer and a plurality of solder balls, the interconnect layer having a plurality of conductive traces:
    a first voltage regulator die of the plurality of voltage regulator dies, and
    a first passive circuit element die of the plurality of passive circuit element dies;
    coupling, via a first conductive trace of the plurality of conductive traces, a first terminal of the first voltage regulator die to a corresponding terminal of the first passive circuit element die; and
    coupling, via a second conductive trace of the plurality of conductive traces, a second terminal of the first voltage regulator die to a first solder ball of the plurality of solder balls.

9. The system package made by the method of claim 8, wherein the method further comprises fabricating an interconnecting region on each voltage regulator die of the plurality of voltage regulator dies using a wafer scale packaging process.

10. The system package made by the method of claim 8, wherein the first voltage regulator die includes a plurality of terminals, and wherein the first passive circuit element die includes one or more passive circuit elements.

11. The system package made by the method of claim 10, wherein a first subset of the plurality of terminals is coupled to respective terminals of a given passive circuit element of the one or more passive circuit elements via a plurality of conductive paths included in the system package.

12. The system package made by the method of claim 8, wherein the method further comprises mounting one or more memories in the system package.

13. The system package made by the method of claim 8, wherein the method further comprises mounting a system-on-a-chip die in the system package.

14. The system package made by the method of claim 8, wherein the method further comprises performing a final test procedure using the system package.

* * * * *